United States Patent [19]

Ferland

[11] Patent Number: 4,755,765
[45] Date of Patent: Jul. 5, 1988

[54] DIFFERENTIAL INPUT SELECTOR

[75] Inventor: Michael R. Ferland, Nashua, N.H.

[73] Assignee: Teradyne, Inc., Boston, Mass.

[21] Appl. No.: 3,945

[22] Filed: Jan. 16, 1987

[51] Int. Cl.$^4$ .............................................. H03F 3/72
[52] U.S. Cl. ................................. 330/252; 307/243; 328/154; 330/295; 330/307
[58] Field of Search ................. 330/51, 69, 252, 295, 330/307; 307/243; 328/154; 370/27, 112, 113

[56] References Cited

U.S. PATENT DOCUMENTS

| | | | |
|---|---|---|---|
| 3,213,290 | 10/1965 | Klein et al. | 307/243 X |
| 3,452,289 | 6/1969 | Ryan | 330/254 |
| 3,477,031 | 11/1969 | Nagata | 330/295 X |
| 3,594,590 | 7/1971 | Smith | 328/154 X |
| 3,716,727 | 2/1973 | Stehlin et al. | 307/243 |
| 4,591,740 | 5/1986 | Anderson et al. | 307/243 X |
| 4,675,562 | 6/1987 | Herlein et al. | 307/243 X |

Primary Examiner—James B. Mullins

[57] ABSTRACT

A differential input selector for selectively connecting one of a plurality of differential inputs to a differential output, the selector including a plurality of pairs of differential input lines, a differential output bus, and a separately powerable differential amplifier connected to each pair of input lines, the amplifier being directly connected to the differential output bus, the amplifier being powered on and off to selectively connect the pair of input lines to the output bus.

2 Claims, 1 Drawing Sheet

DIFFERENTIAL INPUT SELECTOR

FIELD OF THE INVENTION

The invention relates to a differential input selector for selectively connecting one of a plurality of differential inputs to a differential output bus.

BACKGROUND OF THE INVENTION

Differential signal lines, in which a digital signal is transmitted on one line while its complement is transmitted on the other, are useful in time measuring and other high speed applications, because they are immune to signal transmission distortions related to single-ended paths, e.g., noise and temperature.

In a differential input selector for selectively connecting one of a plurality of differential inputs to a differential output bus, both lines of a pair must be switched to the respective lines of the output bus in tandem. One method of providing the switching is connecting the differential input lines to a differential amplifier and connecting each of its differential outputs to an input of a different gate and simultaneously providing control signals over the other inputs to the gates.

SUMMARY OF THE INVENTION

It has been discovered that an input selector for selectively connecting one of a plurality of differential inputs to a differential output bus can be desirably obtained by providing separately powerable differential amplifiers for respective inputs, directly connecting the outputs of the amplifiers to the common output bus, and simply selectively powering on respective amplifiers to selectively connect an input to the output bus.

In preferred embodiments each differential amplifier is provided by a pair of differential amplifier elements provided on an integrated circuit and having common power control in order to provide increased driving power; the pairs of amplifiers have outputs that are aligned with each other in two rows of leads along the sides of the integrated circuit chip, and plural integrated circuit chips in an input selector are aligned so that output lines are straight; termination resistors are provided on the common output bus to provide desired impedance; and power control is provided by an FET. This permits a high-quality transmission line output, high density of integrated circuits, and a very low power control signal.

Other features and advantages of the invention will be apparent from the following description of a preferred embodiment thereof and from the claims.

DESCRIPTION OF THE PREFERRED EMBODIMENT

The preferred embodiment will now be described.

Drawings

Structure

Figure 1:
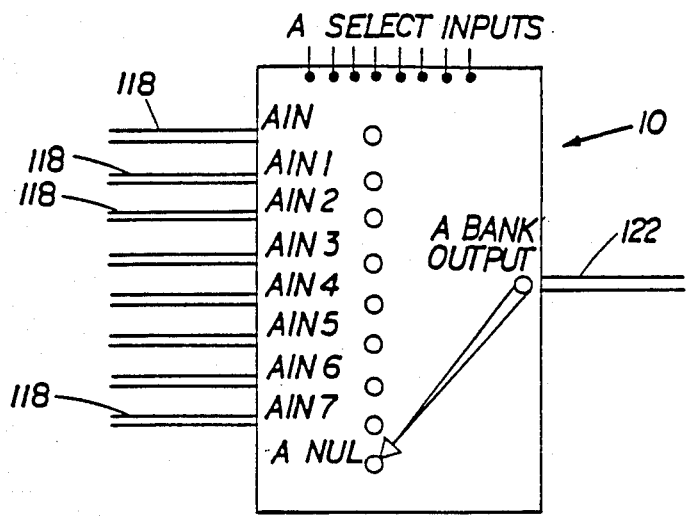
FIG. 1 is a block diagram of a differential input selector according to the invention.

Referring to FIG. 1, there is shown differential input selector 10 for selectively connecting one of a plurality of differential inputs 118 to common differential output bus 122 provided by conductors on a circuit board.

Figure 2:
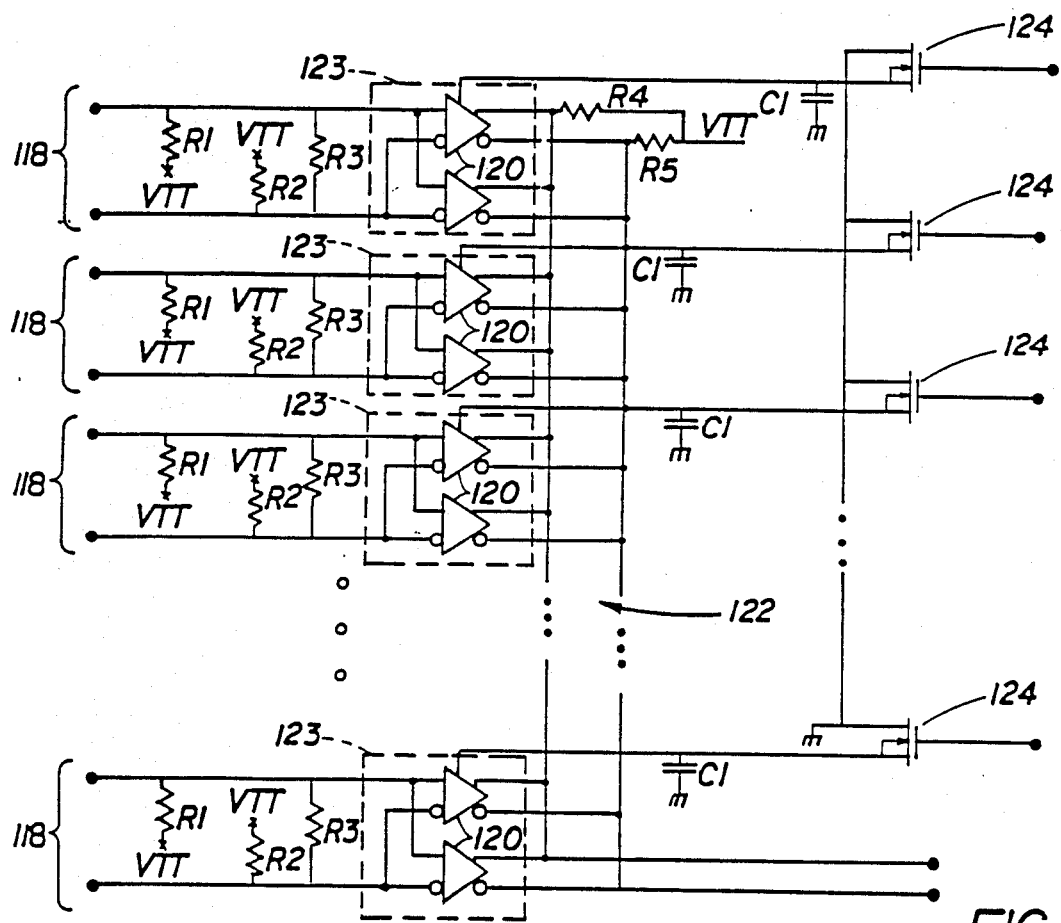
FIG. 2 is an electrical schematic of the FIG. 1 differential input selector.
Figure 3:
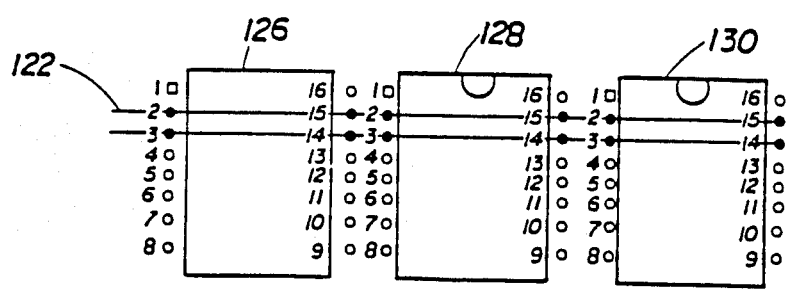
FIG. 3 is a diagram of wiring of integrated circuit chips of the FIG. 1 differential input selector.

Referring to FIG. 2., differential ECL inputs 118 are connected in parallel to pairs of differential amplifier elements 120 (10216) on the same integrated circuit chips, the outputs of which are connected to differential output bus 122. A pair of differential amplifier elements 120 make up a differential amplifier 123. Inputs 118 are connected to terminating resistors R1 (75 ohms), R2 (75 ohms), and R3 (470 ohms). Bus 122 includes termination resistors R4 and R5 (68 ohms). Each pair of differential amplifier elements 120 are powered on and off by transistor 124 (CMOS FET, available from Supertex under designation VNO 106). Capacitor C1 (0.1 uF) is used to bypass the differential amplifiers' power supply. As can be seen in FIG. 3, the output pins (2, 3, 15, 14) of the pairs of differential amplifier elements 120 are in two rows, and adjacent integrated circuits 126, 128, 130 are aligned so that the output bus 122 is straight. This permits a high-quality transmission line output and high density of integrated circuits. FETs 124 are driven by a very low power control signal.

Operation

In operation, a differential input 118 is connected to the differential output bus 122 when a pair of differential amplifier elements 120 is powered on by the associated transistor 124. Termination resistors R1 through R3 match the impedance in input selector 116 to that of the input. Termination resistors R4, R5 match the impedance of the output bus on the printed circuit board. Use of two differential amplifier circuit elements 120 in parallel provides increased power for termiantion resistors R4, R5.

Other Embodiments

Other embodiments of the invention are within the scope of the following claims.

What is claimed is:

1. A differential input selector for selectively connecting one of a plurality of differential inputs to a differential output, said selector comprising
    a plurality of pairs of differential input lines,
    a differential output bus,
    a separately powerable differential amplifier connected to each said pair of input lines, said amplifier being directly connected to said differential output bus, and
    a means to power said amplifier on and off to selectively connect a said pair of input lines to said output bus,
    each said differential amplifier being provided by a pair of differential amplifier elements that are on the same integrated circuit chip and have common power control.
    said pair of differential amplifier elements having output leads that are aligned with each other in two rows of chip leads along the sides of the integrated circuit chip, plural integrated circuit chips being aligned so that output bus lines to which said chip leads are connected and which comprise said differential output bus are straight.

2. The apparatus of claim 1 further comprising termination resistors connected to said input lines to match the impedance of the input.

* * * * *